US008154297B2

(12) United States Patent
Mousavi et al.

(10) Patent No.: US 8,154,297 B2
(45) Date of Patent: Apr. 10, 2012

(54) SYSTEM AND METHOD FOR PREDICTIVE MAINTENANCE OF A BATTERY ASSEMBLY USING TEMPORAL SIGNAL PROCESSING

(75) Inventors: Mirrasoul J. Mousavi, Raleigh, NC (US); Mohamed Maharsi, Garner, NC (US); Deia Bayoumi, Center Valley, PA (US); John J. McGowan, Allentown, PA (US)

(73) Assignee: ABB Technology AG, Zurich (CH)

( * ) Notice: Subject to any disclaimer, the term of this patent is extended or adjusted under 35 U.S.C. 154(b) by 882 days.

(21) Appl. No.: 11/773,504

(22) Filed: Jul. 5, 2007

(65) Prior Publication Data

US 2009/0009183 A1    Jan. 8, 2009

(51) Int. Cl.
*G01N 27/416* (2006.01)
(52) U.S. Cl. .......................... 324/426; 320/134; 320/157
(58) Field of Classification Search .................. 324/426, 324/429, 430, 433, 537; 320/134, 136, 157
See application file for complete search history.

(56) References Cited

U.S. PATENT DOCUMENTS

| | | | |
|---|---|---|---|
| 5,321,626 A | 6/1994 | Palladino | |
| 6,417,668 B1 | 7/2002 | Howard et al. | |
| 6,424,158 B2 | 7/2002 | Klang | |
| 6,441,586 B1 | 8/2002 | Tate, Jr. et al. | |
| 6,611,774 B1 * | 8/2003 | Zaccaria | 702/63 |
| 6,832,171 B2 | 12/2004 | Barsoukov et al. | |
| 2002/0121902 A1 * | 9/2002 | Suzuki | 324/509 |
| 2003/0040873 A1 | 2/2003 | Lesesky et al. | |
| 2006/0025828 A1 | 2/2006 | Armstrong | |

FOREIGN PATENT DOCUMENTS

| | | |
|---|---|---|
| EP | 1243933 | 9/2002 |
| WO | 2005073742 | 8/2005 |

OTHER PUBLICATIONS

R. KieBling, "BATLOG, an Intelligent Battery Monitoring System", Digatron GmbH, pp. 219-223, Aachen, Germany.
Gary J. Markle, "Battery Monitoring . . . 3 Short Stories", BTECH, Inc., pp. 1-6, Whippany, New Jersey.
"Secondary Cells and Batteries—Monitoring of Lead Acid Stationary Batteries—User's Guide", Rapport Technique Technical Report, International Electrotechnical Commission, 2001, pp. 1-79, First edition Sep. 2001, Geneva, Switzerland.
Manfred R. Laidig and John W. Wurst, "Battery Failure Prediction", BTECH, Inc., Whippany, New Jersey.
J. I. Ansell and M. J. Phillips, "Practical Methods for Reliability Data Analysis", Clarendon Press, Oxford, 1994, pp. 142-145.

* cited by examiner

*Primary Examiner* — Edward Tso
*Assistant Examiner* — Aaron Piggush
(74) *Attorney, Agent, or Firm* — Renner, Otto, Boisselle & Sklar, LLP

(57) ABSTRACT

A technique of monitoring a battery assembly may include monitoring a parameter associated with the battery assembly to obtain a number of monitored parameter samples. A temporal sequence of monotonically increasing values may be generated from the monitored parameter samples. The temporal sequence may be analyzed for an indication of a trend in the monitored parameter toward one of an upper operational boundary or a lower operational boundary to predict a fault condition of the battery assembly.

31 Claims, 7 Drawing Sheets

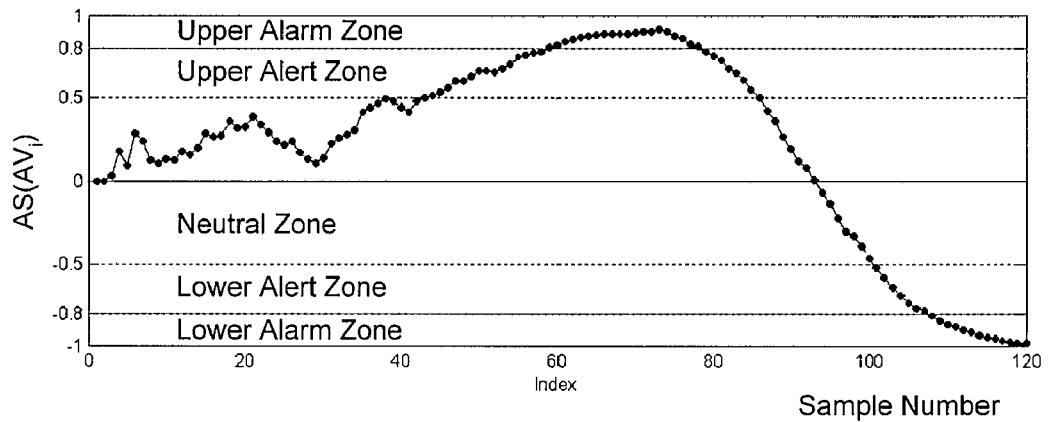
FIG. 6
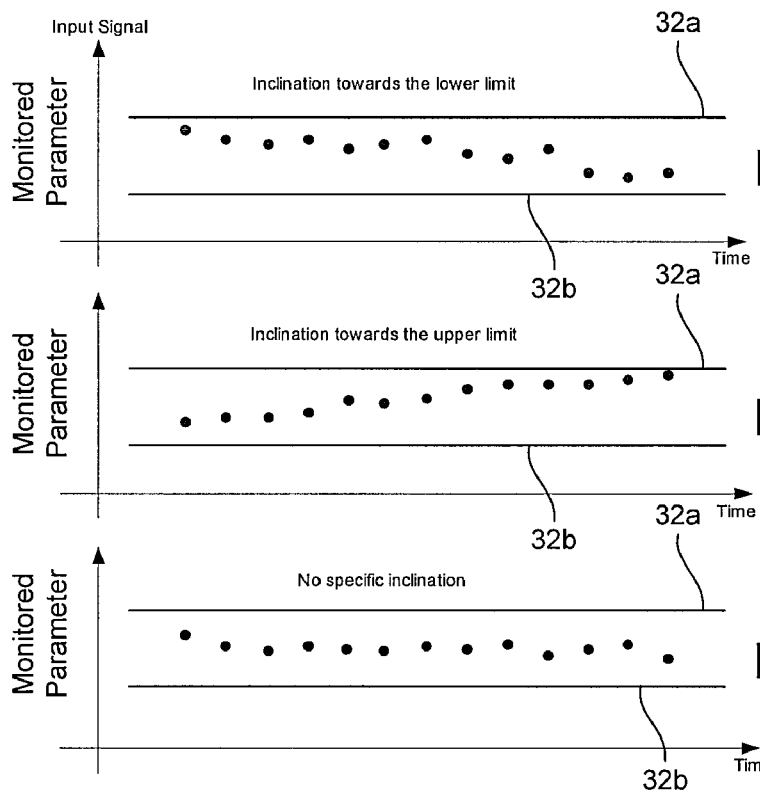
FIG. 7A
FIG. 7B
FIG. 7C

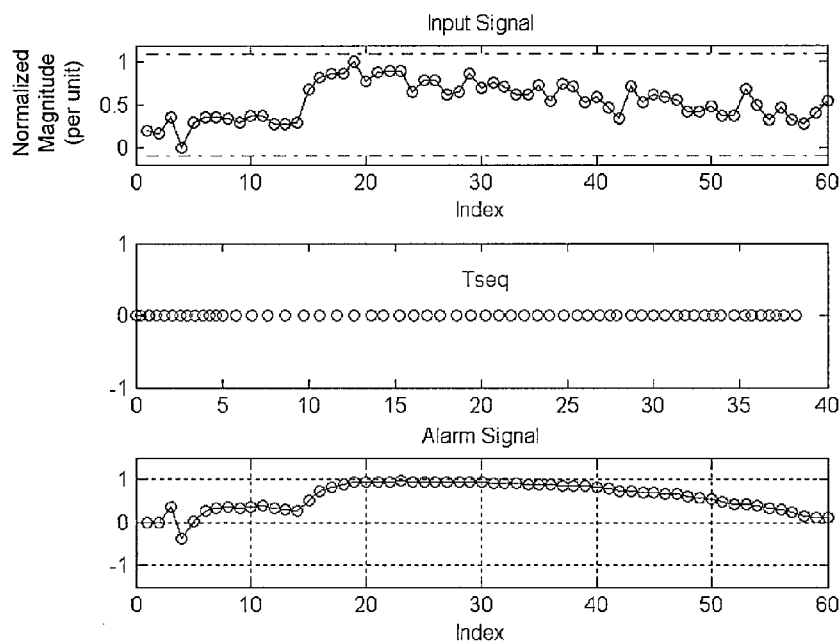
FIG. 11A
FIG. 11B
FIG. 11C
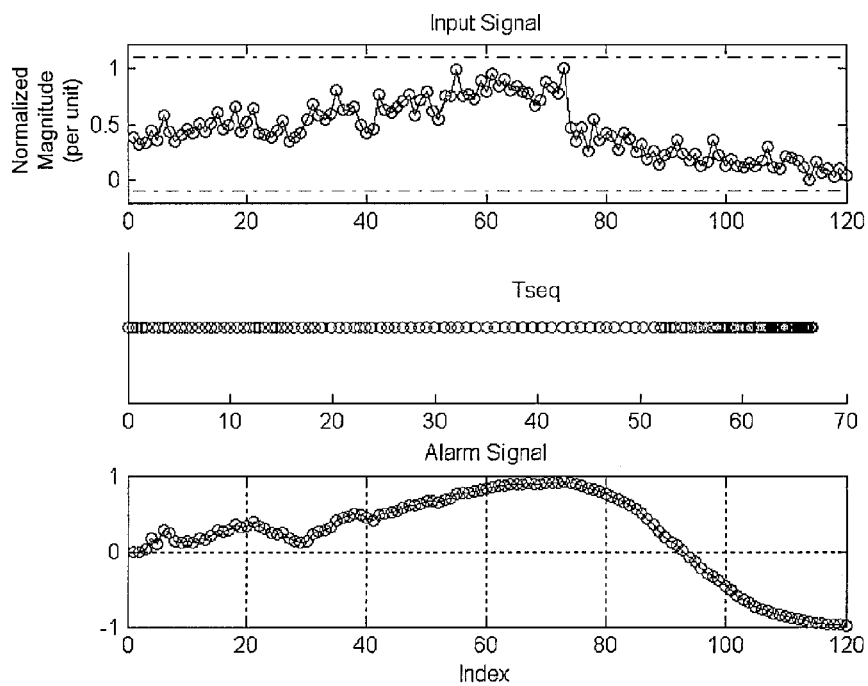
FIG. 12A
FIG. 12B
FIG. 12C

SYSTEM AND METHOD FOR PREDICTIVE MAINTENANCE OF A BATTERY ASSEMBLY USING TEMPORAL SIGNAL PROCESSING

TECHNICAL FIELD OF THE INVENTION

The technology of the present disclosure relates generally to the monitoring and continuous performance assessment of a battery assembly and, more particularly, to a system and method for predictive maintenance of a battery assembly based on temporal processing of a monitored parameter.

DESCRIPTION OF THE RELATED ART

Substations that form part of an electrical power transmission and distribution system are generally used to switch power circuits and transform power from one voltage to another. Substations may include various equipment, such as switches, circuit breakers, buses and transformers. Substations may include one or more battery systems to provide direct current (DC) power to protection relays, circuit breaker control circuits, and other low-power control, monitoring and indication devices in the event of a power system fault or during circuit reconfiguration. If the batteries are not functional and ready to provide reliable power in these situations, protection, control, monitoring, and switching functions would be unavailable.

SUMMARY

In view of the foregoing, there is a need in the art to monitor a battery assembly to assess the health and readiness of the battery assembly while the battery assembly is in use.

According to one aspect of the disclosure, a method of monitoring a battery assembly includes monitoring a parameter associated with the battery assembly to obtain a number of monitored parameter samples; generating a temporal sequence of monotonically increasing values from the monitored parameter samples; and analyzing the temporal sequence for an indication of a trend in the monitored parameter toward one of an upper operational boundary or a lower operational boundary to predict a fault condition of the battery assembly.

According to one embodiment of the method, the analyzing includes deriving an alarm signal from the temporal sequence, the alarm signal having a series of values based on an application of a Laplace test statistic to the temporal sequence values.

According to one embodiment of the method, the analyzing further includes comparing the alarm signal against at least one of an upper threshold or a lower threshold.

According to one embodiment, the method further includes generating an alarm if the alarm signal violates the upper threshold or the lower threshold for a predetermined number of alarm signal values.

According to one embodiment of the method, the analyzing further includes normalizing the alarm signal.

According to one embodiment of the method, the analyzing further includes comparing the normalized alarm signal against at least one of an upper threshold or a lower threshold.

According to one embodiment, the method further includes generating an alarm if the normalized alarm signal violates the upper threshold or the lower threshold for a predetermined number of alarm signal values.

According to one embodiment, the method further includes generating an alarm if the normalized alarm signal violates the upper threshold or the lower threshold.

According to one embodiment of the method, the battery assembly is at least part of a lead acid battery system.

According to one embodiment of the method, the battery assembly is monitored while in use.

According to one embodiment of the method, the battery assembly is a primary power source for a load.

According to one embodiment of the method, the battery assembly is a backup power source for a load.

According to one embodiment of the method, the battery assembly is used in an electrical power transmission and distribution substation.

According to one embodiment of the method, the monitored parameter is a function of at least one of voltage, current, impedance or temperature.

According to another aspect of the disclosure, a program for monitoring a battery assembly includes code that generates a temporal sequence of monotonically increasing values based on a series of monitored parameter samples, the monitored parameter samples obtained by monitoring a parameter associated with the battery assembly; and code that analyzes the temporal sequence for an indication of a trend in the monitored parameter toward one of an upper operational boundary or a lower operational boundary to predict a fault condition of the battery assembly.

According to one embodiment of the program, the code that analyzes derives an alarm signal from the temporal sequence, the alarm signal having a series of values based on an application of a Laplace test statistic to the temporal sequence values.

According to one embodiment, the program further includes code that generates an alarm if a representation of the alarm signal violates an upper threshold or a lower threshold for a predetermined number of alarm signal values.

According to one embodiment of the program, the representation of the alarm signal is a normalized alarm signal.

According to yet another aspect of the disclosure, a predictive monitoring assembly for a battery assembly includes an analyzer that generates a temporal sequence of monotonically increasing values based on a series of monitored parameter samples, the monitored parameter samples obtained by monitoring a parameter associated with the battery assembly, and that analyzes the temporal sequence for an indication of a trend in the monitored parameter toward one of an upper operational boundary or a lower operational boundary to predict a fault condition of the battery assembly.

According to one embodiment of the predictive monitoring assembly, the analyzer derives an alarm signal from the temporal sequence, the alarm signal having a series of values based on an application of a Laplace test statistic to the temporal sequence values.

According to one embodiment of the predictive monitoring assembly, the analyzer generates an alarm if a representation of the alarm signal violates an upper threshold or a lower threshold for a predetermined number of alarm signal values.

According to one embodiment, the predictive monitoring assembly further includes a monitoring assembly that measures a parameter associated with the battery assembly.

According to one embodiment of the predictive monitoring assembly, the battery assembly is at least part of a lead acid battery system.

According to one embodiment of the predictive monitoring assembly, the battery assembly is monitored while in use.

According to one embodiment of the predictive monitoring assembly, the battery assembly is a primary power source for a load.

According to one embodiment of the predictive monitoring assembly, the battery assembly is a backup power source for a load.

According to one embodiment of the predictive monitoring assembly, the battery assembly is used in an electrical power transmission and distribution substation.

According to one embodiment of the predictive monitoring assembly, the monitored parameter is a function of at least one of voltage, current, impedance or temperature.

These and further features will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the scope of the claims appended hereto.

Features that are described and/or illustrated with respect to one embodiment may be used in the same way or in a similar way in one or more other embodiments and/or in combination with or instead of the features of the other embodiments.

BRIEF DESCRIPTION OF THE DRAWINGS

FIG. 6 is an exemplary graphical representation of a multi-level alarming function based on arrival times of the temporal sequence values;

FIGS. 7A, 7B and 7C are plots of exemplary trends in monitored values that correspond to various battery conditions;

FIGS. 11A, 11B and 11C are exemplary plots of an input signal, a temporal sequence and alarm signal, respectively, for a fourth simulated performance assessment of a battery assembly; and FIGS. 12A, 12B and 12C are exemplary plots of an input signal, a temporal sequence and alarm signal, respectively, for a fifth simulated performance assessment of a battery assembly.

DETAILED DESCRIPTION OF EMBODIMENTS

Figure 1:
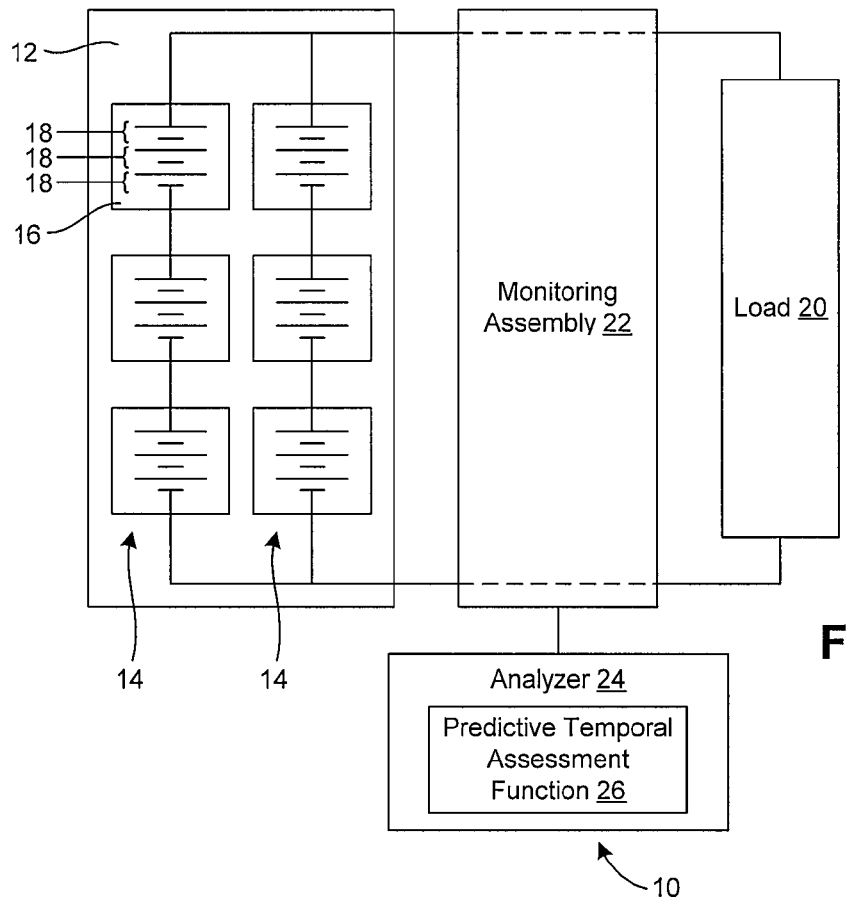
FIG. 1 is a schematic block diagram of an exemplary battery system that includes a predictive monitoring system for a battery assembly.

Embodiments of the present invention will now be described with reference to the drawings, wherein like reference numerals are used to refer to like elements throughout. It will be understood that the figures are not necessarily to scale.

Referring initially to FIG. 1, an exemplary predictive monitoring system 10 for a monitored battery assembly 12 is illustrated. The system 10, and associated method, may identify imminent problems with the battery assembly 12 before the battery assembly 12 fails. In one exemplary application, the system 10 and method may serve as the basis for a predictive maintenance program for in-service electrical substation batteries and intelligent electronic device (IED) power supply components in which health status is ascertained in a continuous and incremental manner. In another exemplary operational context, the battery assembly 12 may be a vehicle battery that powers vehicle equipment. In still another exemplary operational context, the battery assembly 12 may form part of an uninterruptible power supply (UPS) for a computer system, health care device or other electronic device.

In the illustrated example, the battery assembly 12 is a lead acid battery having multiple strings 14 that each include three jars 16 (sometimes referred to as a monobloc) that, in turn, have three cells 18. As will be appreciated, this battery assembly 12 arrangement is exemplary and other arrangements for the battery system 12 are possible. The monitored battery assembly 12 may be a complete battery system or a portion of a battery system, such as one or more cells 18, one or more jars 16 or one or more strings 14 from the battery system. Furthermore, the system 10 and associated method have application to battery assemblies other than lead acid batteries, such as, but not limited to, nickel cadmium batteries, nickel polymer batteries, and nickel zinc batteries. The battery assembly 12 may relate to an unsealed (also referred to as vented) battery configuration or a sealed battery configuration.

The battery assembly 12 is operatively arranged with a load 20 to supply electrical energy to the load 20. In one embodiment, the battery assembly 12 is a primary source or sole source of electricity for the load 20. In other embodiments, the battery assembly 12 is a secondary source or backup source of electricity for the load 20 and is used only when power is not available from a primary source, such as utility power.

In one exemplary operational context, the load 20 includes one or more components of an electrical power transmission and distribution system that are used to switch or interrupt power circuits, perform control, protection, and monitoring, etc. In this operational context, the load 20 may include one or more of protection relays, circuit breaker control circuits, control assemblies, operation status or fault indication devices, any category of IED (e.g., microprocessor-based device, relay, protection or control assembly), and so forth.

Although not illustrated, a charging assembly may be present to maintain the power delivery capacity of the battery assembly 12. For instance, the charging assembly may periodically discharge and trickle charge the battery assembly 12.

The predictive monitoring system 10 may include a monitoring assembly 22 that includes one or more monitoring devices, such as appropriate sensors for making measurements representative of the desired monitored parameter or parameters. Monitoring the health and status of the battery assembly 12 may include monitoring one or more parameters with the monitoring assembly 22. For example, the monitoring assembly 22 may measure one or more of the voltage, current or temperature of the battery assembly 12. Also, internal impedance of the battery assembly 12 may be monitored by measuring both voltage and current, and calculating an impedance value. As indicated, the monitored battery assembly 12 may be an entire battery system or an IED power supply component. In another embodiment, the monitored battery assembly 12 may be a string 14, a jar 16 or a cell 18 that is individually monitored or may be some combination of components (e.g., average impedance of plural strings 14). Thus, the monitored parameter may be monitored while the battery assembly 12 is "on-line" (e.g., in use in a primary capacity or in a secondary capacity) and at any of the cell level, jar level, string level, assembly/system level, or combination of levels.

Focusing on internal impedance values of a battery assembly, for example, it is typical that the impedance rises at a relatively stable rate as the battery assembly ages. But an abnormal, accelerated rate of rise in impedance may be an indication of internal problems of the battery assembly.

As another example, float voltage of a battery assembly may decrease over time. But even if all measured voltage values are within a manufacturer's specified range there still may be an incipient fault condition of the battery assembly. If a conventional battery monitoring approach that relies on instantaneous threshold checking is used, the developing problem with the battery assembly would not be detected, even if advance signs of battery assembly trouble are present.

Conventional monitoring approaches generate alarms in a reactive manner to a problem that is already past the inception stage. For example, in the context of a substation and breaker/switch application, the direct current (DC) voltage measured at the relay or IED terminals may be used to approximate the battery voltage. The measured voltage values have conventionally been compared against a high threshold and a low threshold to respectively detect an overcharge condition and an overdischarge/undercharge condition. Thus, whenever the instantaneous value of the battery voltage violates one of the thresholds, an alarm may be generated. If the battery voltage is between the thresholds, the battery status is considered to be normal. This method tends not to identify battery problems until the battery is faulty and will not perform as a power source, especially for value-regulated lead acid batteries (VRLA) in which the float voltage tends to remain within manufacturer's specified limits even if there is a serious problem with the battery.

Also, many monitoring tasks rely on visual inspections that are made on-site and are based on measurements that rely on expert interpretation. Costs of on-site visual inspections, inconsistent results stemming from manual interpretation, and the inability to make predictions of future battery assembly faults may be associated with most traditional battery monitoring approaches.

The system and method described herein advances the state of the art from the instantaneous threshold crossing techniques in favor of a predictive assessment of the health of the battery assembly 12. Under the disclosed approaches, the time value of a series of monitored parameters is taken into consideration as part of the predictive assessment. This predictive temporal assessment allows consistent prediction or detection of incipient problems before the problem reaches a failure stage. Thus, the temporal signal processing approach leverages chronological information embedded in the monitored parameters to provide a proactive and consistently applied battery assembly 12 monitoring solution.

The predictive temporal assessment may be embodied in an analyzer 24 (FIG. 1) that, with the monitoring assembly 22, forms part of the predictive monitoring system 10. Computational complexity of the predictive temporal assessment is minimized so that the analyzer 24 may be embedded, at least in part, into a control device (not shown) associated with the load 20. For example, the analyzer 24 may be embedded in a substation control device that includes a microprocessor or microcontroller. In another embodiment, the analyzer 24 may be a stand-alone device, such as a general-purpose computer having a processor that executes logical instructions (e.g., software) and a memory (e.g., system memory such as RAM and/or data storage memory such as a hard disk or flash memory).

As will be appreciated, the predictive temporal assessment may be embodied as a predictive temporal assessment function 26. Additional details and operation of the predictive temporal assessment function 26 will be described in greater detail below. The predictive temporal assessment function 26 may be embodied as executable code that is resident in and executed by the analyzer 24. In one embodiment, the predictive temporal assessment function 26 may be a program stored on a computer or machine readable medium. The predictive temporal assessment function 26 may be a stand-alone software application or form a part of a software application that carries out additional tasks related to the analyzer 24 or control module in which the analyzer 24 is embedded. In the embodiments described herein, the predictive temporal assessment function 26 is embodied as executable code that is executed by a processing device. But the functionality of the predictive temporal assessment function 26 could be carried out via dedicated hardware (e.g., circuitry), firmware, or some combination of hardware, firmware and/or software.

In the illustrated embodiment, analysis of the monitored parameter(s) is performed locally. For instance, the analyzer 24 is located in close relative proximity to the battery assembly 12. In a substation application, the analyzer 24 may be located at the substation site. In another embodiment, the monitored parameter(s) may be transmitted to another location for processing, such as a central monitoring station that analyzes battery information for one or more assemblies, possibly having various geographic locations.

The techniques for predictive monitoring of the battery assembly 12 allow for just-in-time maintenance of the battery assembly 12 and IED power supply components. The techniques use information obtained from online and continual monitoring of at least one parameter associated with the battery assembly 12 over a period of time. The monitored parameter may be measured at regular intervals and recorded (e.g., stored) for analysis. After collecting a statistically sufficient number of data points, analysis may be conducted to assess the health and status of the battery assembly 12. Abrupt changes in the monitored parameter may be instantly identified and addressed. Gradual changes in the monitored parameter may be identified through the analysis and a sustained inclination toward a warning level may be used to trigger a just-in-time alarm (e.g., warning signal). A user may react to the alarm to take further investigative action or corrective action, such as maintaining, repairing or replacing all or part of the battery assembly 12.

The predictive monitoring technique may use chronological information embedded in a monitored parameter to detect gradual, but sustained, deviations in the monitored parameter. Also, the degree of downward or upward movement of the monitored parameter may be estimated over time. This advance in battery monitoring allows for proactive measures to be taken to manage battery maintenance and avoid unexpected contingencies and failures. As will become more apparent below, the battery condition analysis is based on the current value of the monitored parameter as well as previous values. The monitored parameter may be sampled at regular time intervals and the ascertained values may be stored in a database for automated analysis upon the collection of a predetermined number of values.

Design choices may be made as to how often to obtain values of the monitored parameter. For instance, in situations where reliance is made on the battery assembly 12 as a primary power source, the monitored parameter may be sampled with a relatively high frequency (e.g., about every five or ten minutes). In other situations, such as when the battery assembly 12 is a secondary power source, the monitored parameter may be sampled less frequently (e.g., about every half hour or hour).

The monitored parameter may be a parameter that is directly measured, such as voltage, current, or temperature. Alternatively, the monitored parameter may be a combination of directly measured values, such as impedance derived from measured voltage and measured current. The predictive analysis may be carried out for just one monitored parameter or repeated for additional monitored parameters.

Figure 2:
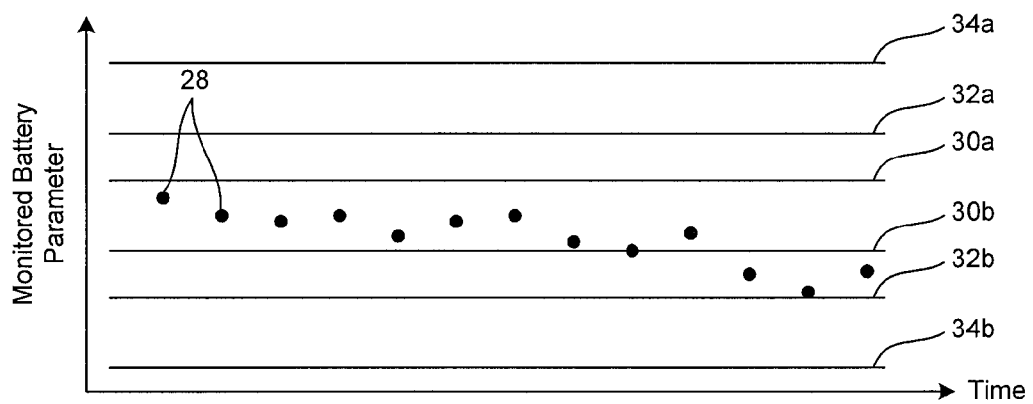
FIG. 2 is an exemplary graphical representation of a multi-level, multi-sided monitoring approach for a battery assembly.

With additional reference to FIG. 2, the values of the monitored parameter may be processed with respect to a multi-level, two-sided monitoring concept. The monitoring concept of the illustrated embodiment is a three-level, two-sided approach. In FIG. 2, and ensuing figures, values for the monitored parameter are represented by dots and will be referred to as values 28. The illustrated two-sided approach plots the magnitude of the monitored parameter (e.g., the y-axis) against time (e.g., the x-axis).

The levels of the multi-level approach correspond to predetermined boundaries indicative of battery condition. For example, in the illustrated embodiment, normal fluctuations of the monitored parameter generally fall between an upper ordinary operational boundary 30a and a lower ordinary operational boundary 30b. The upper and lower ordinary operational boundaries 30 are nested within an upper extraordinary operational boundary 32a and a lower extraordinary operational boundary 32b. The regions between the ordinary operational boundaries 30 and the extraordinary operational boundaries 32 correspond to semi-normal operation of the battery assembly 12. The extraordinary operational boundaries 32 are nested within an upper alert boundary 34a and a lower alert boundary 34b, which correspond to a problematic condition associated with the battery assembly 12. The predictive monitoring technique quantifies trends in the monitored parameter and may alert a user at an appropriate time. As will become more apparent below, the aggregate behavior of the battery assembly 12 over time is used to assess the health and status of the battery assembly 12 rather than instantaneous fluctuations with respect to a threshold value.

Figure 3:
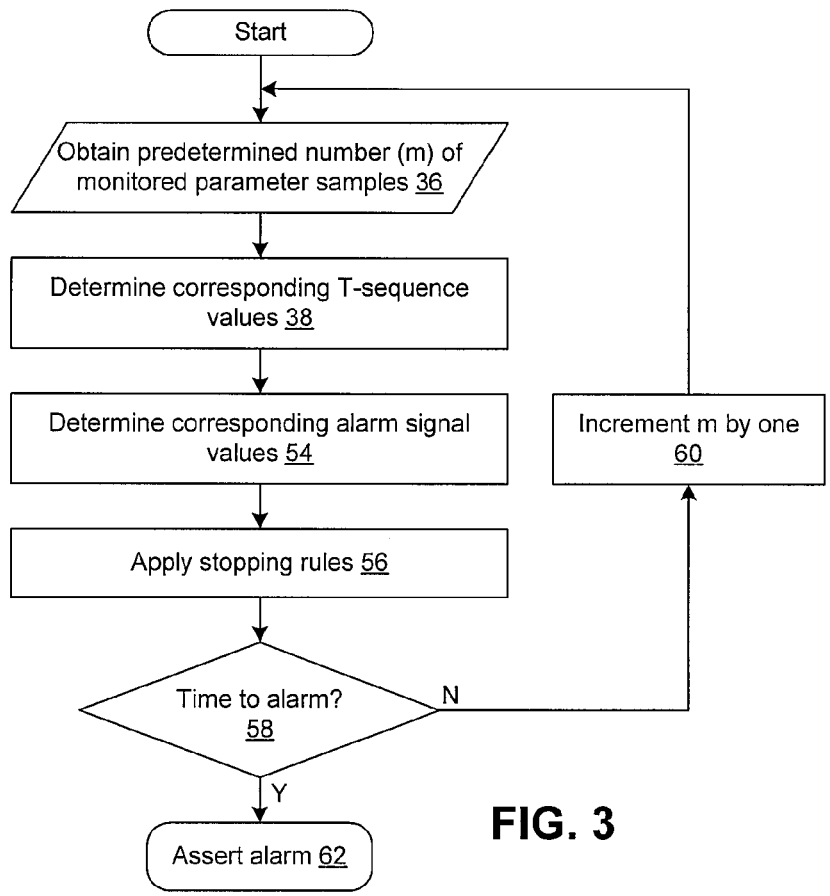
FIG. 3 is a flow diagram of an exemplary method of predictive battery monitoring and maintenance.

With additional reference to FIG. 3, illustrated is a flow diagram of an exemplary method of predictive battery monitoring. The exemplary method may be carried out by executing an embodiment of the predictive temporal assessment function 26, for example. Thus, the flow chart of FIG. 3 may be thought of as depicting steps of a method carried out by the analyzer 24. The method generally includes determining a temporal sequence ("T-sequence") based on monitored parameter values, determining alarm signal values corresponding to the T-sequence values and applying a set of stopping rules.

The method may commence in block 36 where a predetermined number of values for the monitored parameter are obtained. The monitored parameter may be a function of one or more of voltage, current, impedance or temperature. For instance, the monitored parameter could be a directly measured value or a value derived from a measured value, such as, but not limited to, the average impedance of the cells in the battery system 12. The predetermined number will be represented by the variable "m." In theory, m could be as few as three values, but the output of the trend analysis can have more practical significance when more values are collected and analyzed.

Figure 4:
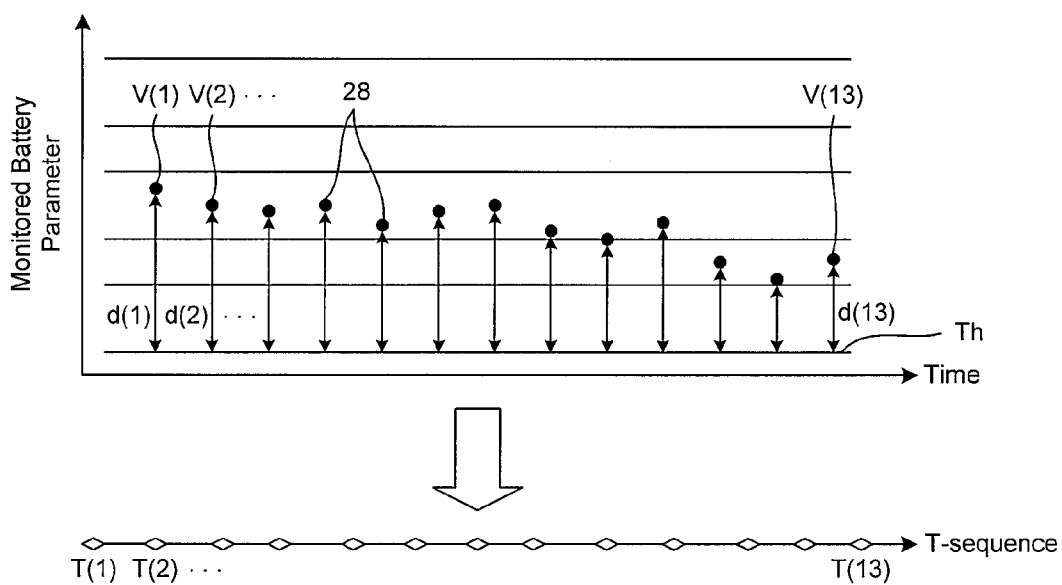
FIG. 4 is an exemplary graphical representation of a mapping of monitored values to a temporal sequence.

With additional reference to FIG. 4, an exemplary series of thirteen monitored parameter values 28 are plotted and further labeled as V(1) for the first (or oldest monitored parameter value) through V(13) for the thirteenth monitored parameter value. For purposes of the illustrated example, it may be assumed that m has been set to thirteen. Therefore, V(13) may be considered the V(m) value in the illustrated example.

The monitored parameter values 28 show fluctuations in the magnitude of the monitored parameter values 28 over time. In order to perform a temporal analysis of the condition of the battery assembly 12, these fluctuations may be transformed into a series of chronologically ordered sequence values referred to as the T-sequence. Thus, the logical flow may proceed to block 38 where a series of T-sequence values corresponding to the monitored parameter values 28 is determined. The determination of the T-sequence may be considered a y-axis mapping of monitored parameter values 28 to an x-axis sequence of data points that quantify the movement of the monitored parameter toward a selected boundary (e.g., of the boundaries 30, 32, or 34). The data points include a time component. Collectively, the sequence of data points is monotonically increasing and may be viewed as a chronologically ordered sequence of "arrival times." Adjacent pairs of arrival times are separated by "inter-arrival times."

Figure 5:
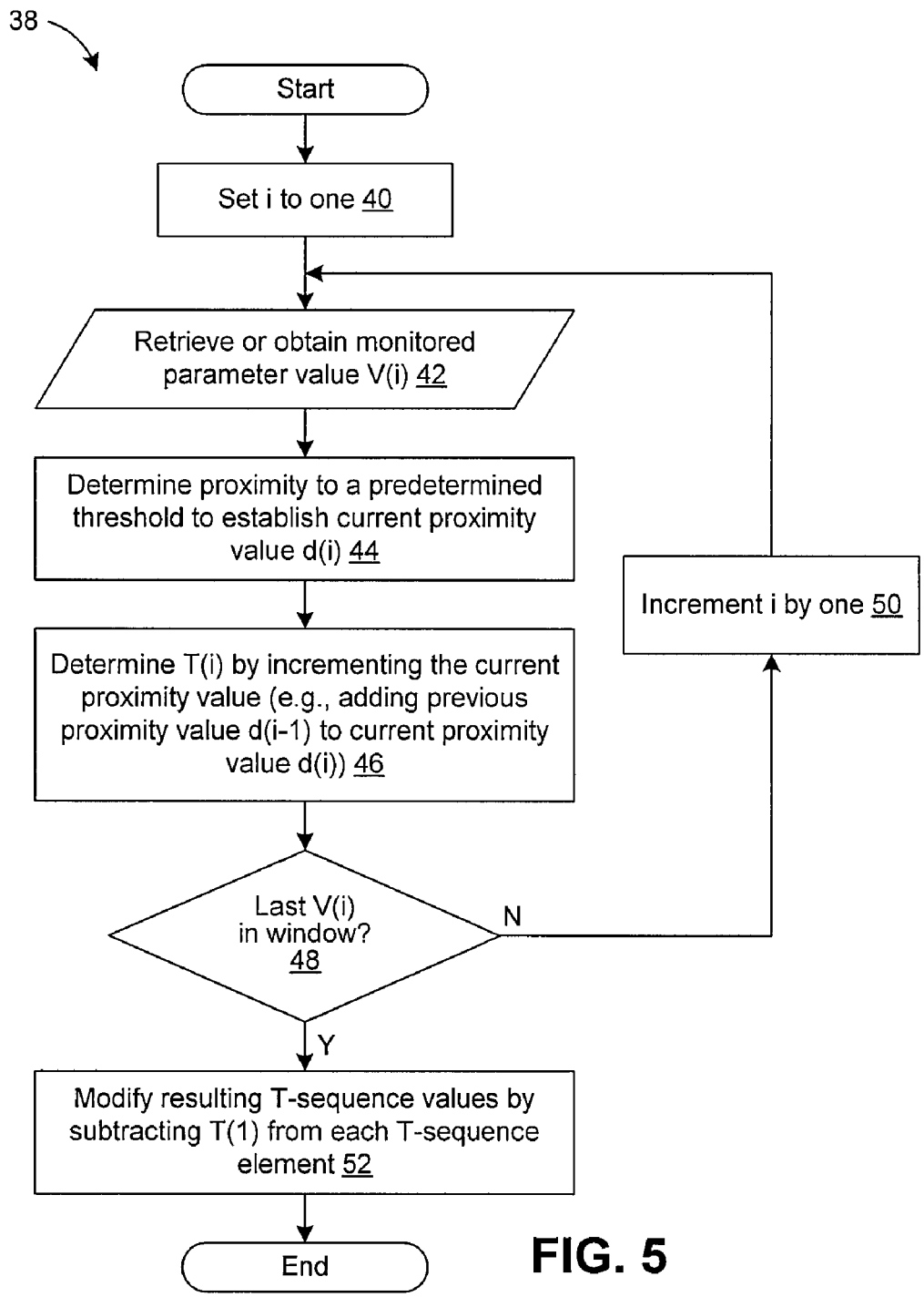
FIG. 5 is a flow diagram of an exemplary method of determining the temporal sequence values from monitored battery conditions.

Block 38 is further described with additional reference to FIG. 5, which is an exemplary flow diagram illustration of a method of determining a T-sequence from the monitored parameter values 28. Determining the T-sequence may commence in block 40 where an integer value "i" is set to one. Next, in block 42, the monitored parameter value 28 for the value of i is retrieved, such as reading the value V(i) from a memory that stores the monitored parameter values. Alternatively, the logical flow may be carried out as the monitored parameter is sampled.

In block 44, the proximity of the monitored parameter value V(i) to a predetermined threshold is determined. The predetermined threshold may be, for example, a threshold corresponding to one of the boundaries 30a, 30b, 32a, 32b, 34a or 34b. It will be appreciated that determination of proximity with respect to a threshold corresponding to a lower boundary (e.g., 30b, 32b or 34b) implicitly indicates proximity to the associated upper boundary (e.g., 30a, 32a or 34a, respectively), and vice versa. The threshold may have a magnitude value that is the same as the magnitude of the boundary of interest, a magnitude value that is a function of the magnitude of the boundary of interest, or some other value.

In the illustrated example, the proximity of the monitored parameter value V(i) with respect to a threshold corresponding to the lower alert boundary 34b is determined. The proximity may be the numerical difference between the value V(i) and the magnitude of the threshold, which is represented by a line identified as "Th." The proximity may be numerically expressed as a proximity value d(i). In the illustrated example of FIG. 4, the proximity values are represented by arrows that are respectively labeled d(1) through d(13). In this example, the T-sequence and the alarm signal values that result from the described techniques will be indicative of a trend in the monitored parameter toward either the lower alert boundary 34b or the upper alert boundary 34a.

Next, in block 46, a T-sequence value T(i) corresponding to the current proximity value d(i) may be determined. The T-sequence value T(i) may be determined by an incremental approach, such as adding the previous proximity value (e.g., d(i−1)) to the current proximity value d(i). If i is equal to one, there may not be a previous proximity value. In this case, the T-sequence value is the current proximity value d(i). In FIG. 4, the T-sequence values are represented as diamonds positioned along a horizontal axis. Following the illustrated example, the T-sequence values in FIG. 4 are labeled T(1) through T(13).

Following block 46 for the current value of i, the logical flow may proceed to block 48 where a determination is made as to whether the last monitored parameter value in the window of m samples has been converted to a T-sequence value. For example, a negative determination may be made in block 48 if i is less than m. If a negative determination is made in block 48, the logical flow may proceed to block 50 where the value of i is incremented by one. Following block 50, the logical flow may return to block 42 to calculate the next T-sequence value.

If a positive determination is made in block 48, the logical flow may proceed to block 52 where the T-sequence may be finalized by offsetting the determined T-sequence values such that the first T-sequence value T(1) is equal to zero and the relative spacing between the T-sequence values is maintained. For instance, the first T-sequence value T(1) may be subtracted from each of the T-sequence values T(1) through T(m). Offsetting the T-sequence in this manner facilitates the determination of an alarm signal as described in greater detail below.

As will be appreciated, the T-sequence provides a notion of time and a notion of how close the monitored value is getting to the upper or lower boundary of interest. For instance, if one T-sequence value has a value of one and the next T-sequence value is five, the separation between the values is four. If the next T-sequence value is seven, the separation to the previous value is two. The decrease in separation between adjacent pairs of T-sequence values shows that the monitored value is moving toward the lower boundary. The increase in separation between adjacent pairs of T-sequence values would show that the monitored value is moving toward the upper boundary. The opposite would be found if the proximity of the monitored parameter values 28 is determined with respect to an upper threshold rather than a lower threshold.

Returning to the logical flow of FIG. 3, once the T-sequence is determined in block 38 the logical flow may proceed to block 54 where alarm signal values corresponding to the T-sequence values are determined. The alarm signal values are given the designation AV(i). The alarm sequence values quantitatively assess the existence of an upward or downward inclination in the monitored parameter and provide a basis as to whether to generate an alarm to warn an operator of the onset of a problem with the battery assembly 12.

The alarm signal may be made up of alarm signal values AV(i) generated by the application of a Laplace Test Statistic (LTS) to the T-sequence values (m number of arrival times) in their chronological order within the observation window of (0, T(m)). The LTS for the set of m T-sequence values may be represented by equation 1.

$$LTS = \frac{\frac{\sum_{i=1}^{m-1} T(i)}{m-1} - \frac{T(m)}{2}}{T(m) \times \sqrt{\frac{1}{12(m-1)}}} \qquad \text{Eq. 1}$$

Under a null hypothesis of homogenous Poisson process (HPP), the result of the application of the LTS to the T-sequence will tend to be normally distributed. Large positive or large negative values will reject the null hypothesis of no trend at a selected confidence level, where ±1.96 corresponds to a 95 percent two-sided confidence level. But unlike reliability studies in which LTS is typically applied, the LTS is used in the temporal analysis by applying the LTS to a monotonically growing window of T-sequence values. The resulting LTS values are the alarm values AV(i) in accordance with equation 2.

$$AV(i)=LTS|_{T\text{-}sequence(1,\ldots,i)} \qquad \text{Eq. 2}$$

The alarm values will tend to fluctuate between positive and negative values according to the interval between T-sequence values. To make consistent predictions and apply consistent alarm thresholds, the alarm values AV(i) (sometimes referred to as $AV_i$) may be normalized so that normalized alarm values, referred to as $AS(AV_i)$, have a value in the range of −1 (minus one) to +1 (positive one). The alarm signal values may be normalized using a numerical version of equation 3.

$$AS(AV_i) = 1 - \sqrt{\frac{2}{\pi}} \int_{-\infty}^{AV_i} e^{-\frac{t^2}{2}} dt \text{ where } -1 \le AS(AV_i) \le +1 \qquad \text{Eq. 3}$$

With additional reference to FIG. 6, illustrated is an exemplary graphical representation of a multi-level alarming function based on arrival times of the temporal sequence values. In FIG. 6, the y-axis represents the magnitude of the normalized alarm values and the x-axis represents the sample number from one to the end of the observation window, which is 120 samples in the example of FIG. 6.

The range of possible normalized alarm values may be broken into multiple zones. In the illustrated embodiment, there are three zones, including a neutral zone, an alert zone and an alarm zone. The alert zone and the alarm zone may each have an upper portion and a lower portion for respectively indicating upward trending of the monitored parameter and downward tending of the monitored parameter. Less than three zones or more than three zones may be used.

The establishment of zones for the normalized alarm values may assist in applying the multi-level monitoring concept introduced above with the respect to FIG. 2 to the alarm signal. For instance, when the normalized alarm values are in the neutral zone of the illustrated example, normal operating conditions may be indicated. When the normalized alarm values persist in the upper alert zone, trending of monitored parameter toward failure in the upward direction may be indicated. When the normalized alarm values persist in the lower alert zone, trending of monitored parameter toward failure in the downward direction may be indicated. Similarly, when the normalized alarm values persist in either of the lower alarm zone or the upper alarm zone, failure or imminent failure of the battery assembly may be indicated.

Following generation of the alarm signal and, if appropriate, the normalized alarm signal in block 54, the logical flow may proceed to block 56. In block 56, stopping rules may be applied to one or both of the alarm signal or the normalized alarm signal. By way of example, the stopping rules described in this document are only applied to the normalized alarm signal. But modification to the stopping rules for application to the alarm signal is possible.

The stopping rules are a set of criteria that, when satisfied, are indicative of sufficient upward or downward trending in the monitored parameter to inform a user that attention to the battery assembly 12 may be appropriate. Multiple upper and lower thresholds (also referred to as limits) may be established so that alarms are generated for various corresponding conditions or graduations in severity of the trending of the monitored parameter. Therefore, some alarms may be considered more severe than other alarms. For example, some alarms may be cautionary alerts while others may be more urgent warnings. The alarms may take any appropriate form, such as a message, a signal, or some other mechanism to convey information to a local device, a remote device (e.g., central monitoring station located apart from the location of the physical location of the predictive monitoring system) and/or a person. The alarm may result in an audible and/or visual output at a workstation (e.g., a computer and associated display), an indicator panel, etc.

With additional reference to FIGS. 7A, 7B and 7C, the alarm signal or the normalized alarm signal provide a quantitative mechanism against which the stopping rules may be formulated. FIGS. 7A, 7B and 7C are plots of exemplary trends in the monitored parameter(s). For instance, in FIG. 7A, the monitored parameter presents a downward inclination toward the lower extraordinary operational boundary 32b (or, alternatively, the lower alert boundary 34b). In response to this trend, the inter-arrival times associated with the corresponding T-sequence (e.g., separation between T-sequence values) will tend to get smaller. This, in turn, translates to movement of the normalized alarm signal toward negative one. In FIG. 7B, the monitored parameter presents an upward inclination toward the upper extraordinary operational boundary 32a (or, alternatively, the upper alert boundary 34a). In response to this trend, the inter-arrival times associated with the corresponding T-sequence will tend to get larger. This, in turn, translates to movement of the normalized alarm signal toward positive one. In FIG. 7C, there is no specific inclination (e.g., the normalized alarm signal values remain in the neutral zone), and a resulting normalized alarm signal will tend to stay in the neutral zone (e.g., an exemplary neutral zone is illustrated in FIG. 6).

Based on possible behaviors of the alarm signal, the stopping rules may be constructed to focus on at least one lower limit (referred to as $T_{low}$) and at least one upper limit (referred to as $T_{hi}$). It will be recognized that multiple lower limits and multiple upper limits may be established so that alarms may be generated for movement of the normalized alarm signal with respect to multiple thresholds. The stopping rules may be constructed so that the alarm(s) may be asserted in a predictive manner. For instance, the limit may be established so that the limit may be crossed by the normalized alarm signal before the monitored value crosses a corresponding boundary (e.g., boundary 40, 42 or 44). For instance, in an embodiment with just one lower limit and one upper limit, two base stopping rules may be constructed. The first rule may read, if $AS(AV_i)$ is less than or equal to $T_{low}$, then the alarm signal has violated the low threshold. If desired, an alarm indicating that the corresponding lower boundary is approached may be generated. The second rule may read, if $AS(AV_i)$ is greater than or equal to $T_{hi}$, then the alarm signal has violated the high threshold. If desired, an alarm indicating that the corresponding upper boundary is approached may be generated.

There may be instances where the first or second rule is satisfied, but there is not an incipient fault condition of the battery. For instance, the monitored parameter may trend toward a boundary (e.g., boundary 42 or boundary 44) and return to neutral operation. In other situations, a condition unrelated to the battery assembly 12 may lead to satisfying one of the rules. In view of these possibilities, the predictive monitoring system 10 may be configured based on user preferences to make trade-offs between the probability of generating a false alarm and the probability of generating an alarm further into the inception of a fault than would otherwise be desired.

In one embodiment, the values of $T_{hi}$ and $T_{low}$ may be selected based on the user's tolerance for false alarms and the desired timeliness of alarms. The probability of false alarms may decrease as the absolute value of $T_{hi}$ and $T_{low}$ increase. As the absolute value of $T_{hi}$ and $T_{low}$ increase, the longer it may take to generate an alarm for an incipient fault (e.g., the battery assembly 12 may be further into an incipient fault than if the $T_{hi}$ and $T_{low}$ values had been set to lower values). Therefore, the values of $T_{hi}$ and $T_{low}$ may be established for each battery assembly 12 monitoring application as is based on experience, user preferences, technical data for the battery assembly 12, the relative importance of the use of the battery assembly 12, loss resulting from conductors through which measurements are taken and so forth. An exemplary default value for $T_{hi}$ may be about 0.90, but other values may be used (e.g., about 0.80, about 0.85, or about 0.95). Similarly, an exemplary default value for $T_{low}$ may be about negative 0.90, but other values may be used (e.g., about negative 0.80, about negative 0.85, or about negative 0.95). $T_{hi}$ and $T_{low}$ may have the same or different absolute values.

In another embodiment, the stopping rules may be modified to generate an alarm after a consecutive number of violations of the base stopping rules. This may reduce the likelihood of false alarms by mitigating the impact of noise and outliers.

Under the modified stopping rules, each time the alarm signal $AS(AV_i)$ is less than or equal to $T_{low}$, then a "low" violation is recorded. Similarly, each time the alarm signal $AS(AV_i)$ is greater than or equal to $T_{hi}$, then a "high" violation is recorded. Consecutive low violations and consecutive high violations are separately counted toward a maximum number of permissible consecutive low violations ($NOPCV_{low}$) and toward a maximum number of permissible consecutive high violations ($NOPCV_{hi}$), respectively. If $NOPCV_{low}$ is greater than or equal to a predetermined threshold ($N_{low}$), then an alarm that the corresponding lower boundary is approached may be generated. Similarly, if $NOPCV_{hi}$ is greater than or equal to a predetermined threshold ($N_{hi}$), then an alarm that the corresponding upper boundary is approached may be generated. The thresholds $N_{low}$ and $N_{hi}$ may be expressed in terms of a number of samples and may have the same or different values. In one embodiment, one or both of the thresholds $N_{low}$ and $N_{hi}$ may be about 3 samples, 5 samples, 8 samples, 10 samples, or some other number of samples.

In one embodiment, multiple base stopping rules and/or modified stopping rules may be applied. For instance the normalized alarm signal may be applied against plural limit values ($T_{low}$ and/or $T_{hi}$) and/or plural threshold values ($N_{low}$ and/or $N_{hi}$). In this manner, multiple alarms may be generated based on various combinations of behaviors of the battery assembly 12.

With continuing reference to FIG. 3, following application of the stopping rules in block 56, the logical flow may proceed to block 58 where a determination is made as to whether the stopping rules and/or modified stopping rules result in the generation of an alarm. If a negative determination is made in block 58, the logical flow may proceed to block 60 where the predetermined number of monitored parameter values m is incremented by one. Following block 60, the logical routine may return to block 36. Using the incremented value for m, the technique of battery assembly 12 monitoring may be repeated. When repeated, the previously ascertained values for the monitored parameter, T-sequence, alarm signal and/or normalized alarm signal may be retained for reuse. In this manner, the observation window may be expanded by one sample and the prior samples are reused. In another embodiment, the oldest sample is not used so that the observation window remains the same size as prior iterations of the technique, but the observation window advances forward with each iteration. In still another embodiment, no prior samples are reused so that a completely new observation window is established after a time period corresponding to m samples has elapsed.

If a positive determination is made in block 58, the logical flow may proceed to block 62. In block 62, the alarm corresponding to the breach of the stopping rule or modified stopping rule that resulting in the positive determination may be asserted. As indicated, the alarms may take any appropriate form, such as a message, a signal, or some other mechanism to convey information to a local device, a remote device and/or a person. In one embodiment, the logical flow may end in block 62. The monitoring technique may be reset and/or restarted after the battery assembly 12 is inspected and/or corrective action is taken. In another embodiment, following block 62, the logical flow may proceed to block 60 to continue monitoring of the battery assembly 12.

It will be appreciated that portions of the logical routine may be repeated to derive an additional T-sequence based on proximity values that are determined with respect to another threshold (e.g., boundary 30, 32 or 34). An additional alarm signal and normalized alarm signal may be generated, which may be compared against stopping rules or modified stopping rules. Also, the logical routine may be separately carried out for a different monitored parameter.

With additional reference to FIGS. 8A through 12C, examples of the operation of the battery assembly 12 monitoring technique will be presented. The examples are computer simulations of the application of the technique to various input signals, where the input signals represent a monitored parameter over time. The input signals of the following examples are normalized signals that may represent a function of one or more of voltage, current, impedance or temperature of the battery assembly 12 since the predictive monitoring technique is independent of the battery parameter that is monitored. For these examples, the input signal is assumed to vary within specified boundaries, which are represented in the figures with dashed/dotted lines.

Figures 8A, 8B, 8C:
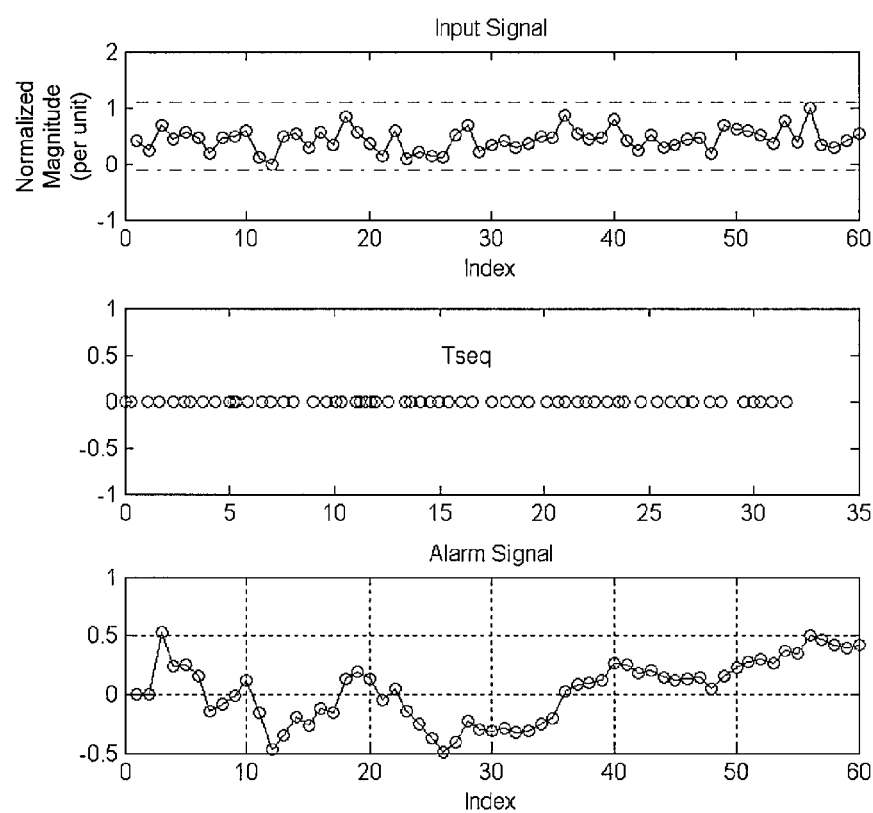
FIGS. 8A, 8B and 8C are exemplary plots of an input signal, a temporal sequence and alarm signal, respectively, for a first simulated performance assessment of a battery assembly.

FIGS. 8A, 8B and 8C correspond to a first example where the input signal (represented in FIG. 8A) fluctuates randomly between an upper and a lower boundary. In this example, there is no monotonic tendency toward either of the boundaries. FIG. 8B illustrates a T-sequence corresponding to the input signal of FIG. 8A. FIG. 8C illustrates a normalized alarm signal derived from the T-sequence of FIG. 8B. The normalized alarm signal conveys no specific inclination and generally varies in a neutral zone (e.g., a range of about −0.5 to about 0.5). In this example, no alarm is generated in response to the behavior of the input signal.

Figure 9A:
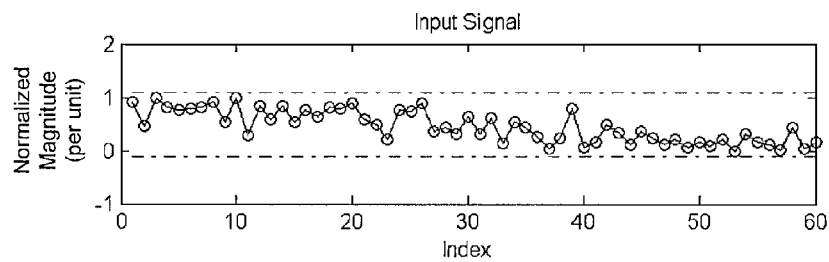
FIGS. 9A, 9B and 9C are exemplary plots of an input signal, a temporal sequence and alarm signal, respectively, for a second simulated performance assessment of a battery assembly.
Figure 9B:
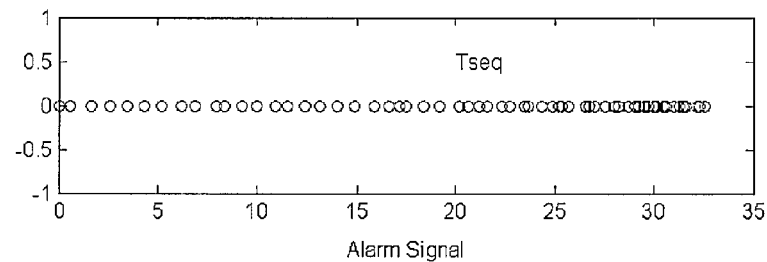
Figure 9C:
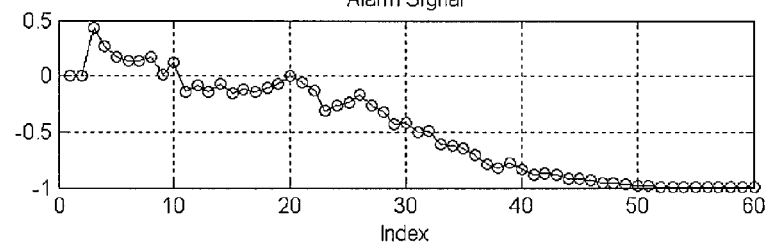

FIGS. 9A, 9B and 9C correspond to a second example where the input signal (represented in FIG. 9A) gradually approaches a lower boundary. Thus, in this example, there is a monotonic tendency toward the lower boundary. FIG. 9B illustrates a T-sequence corresponding to the input signal and shows an increasing rate of arrival times toward the end of the observation window. The normalized alarm signal, as shown in FIG. 9C presents a quantitative view of the inclination toward the lower limit. If the alarm threshold $T_{low}$ were set to about −0.95, an alarm could be generated when the normalized alarm signal crosses the threshold as a predictive indication of a problem with the battery assembly 12 (which is illustrated to occur at sample 47 in FIG. 9C).

Figure 10A:
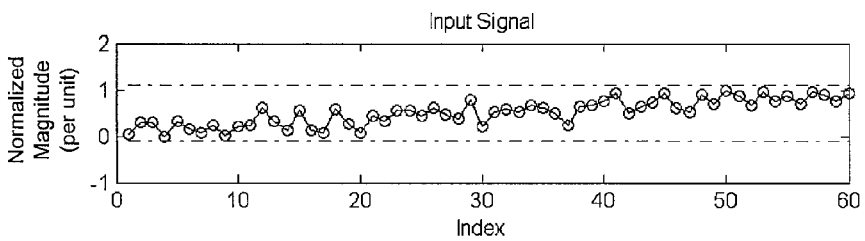
FIGS. 10A, 10B and 10C are exemplary plots of an input signal, a temporal sequence and alarm signal, respectively, for a third simulated performance assessment of a battery assembly.
Figure 10B:
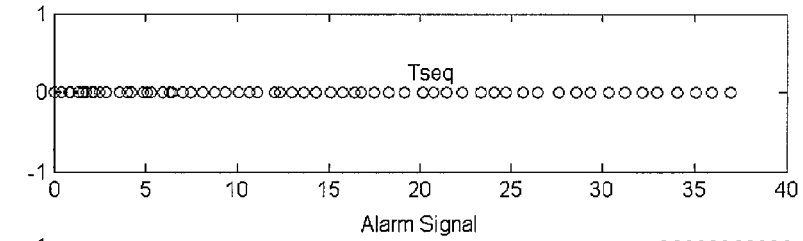
Figure 10C:
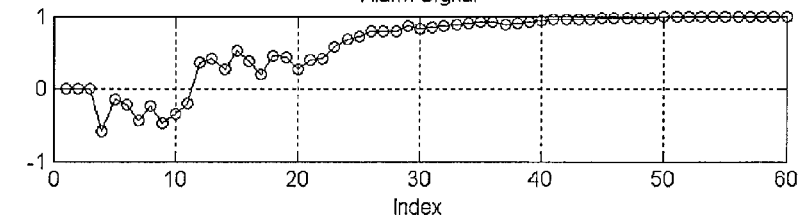

FIGS. 10A, 10B and 10C correspond to a third example where the input signal (represented in FIG. 10A) gradually approaches an upper boundary. Thus, in this example, there is a monotonic tendency toward the upper boundary. This behavior could be a typical failure pattern when internal impedance of a jar, string or larger collection of battery components is used as the monitored parameter. FIG. 10B illustrates a T-sequence corresponding to the input signal and shows a decreasing rate of arrival times toward the end of the observation window, thereby indicating sustained deviations of the input signal from the lower boundary. The normalized alarm signal, as shown in FIG. 10C presents a quantitative view of the inclination toward the upper limit. If the alarm threshold $T_{hi}$ were set to about 0.95, an alarm could be generated when the normalized alarm signal crosses the threshold as a predictive indication of a problem with the battery assembly 12 (which is illustrated to occur at sample 41 in FIG. 10C).

FIGS. 11A, 11B and 11C correspond to a fourth example where the input signal (represented in FIG. 11A) includes an upward inclination followed by a downward inclination. This may be considered composite behavior of the input signal. In this example, there is an upward trend in the first twenty samples of the input signal and a downward trend thereafter. The T-sequence (FIG. 11B) and normalized alarm signal (FIG. 11C) pick up the initial upward trend. Then, the normalized alarm signal returns into the neutral zone as the input signal moves away from the upper limit. The modified stopping rules may be set to allow this behavior without generating an alarm (e.g., $N_{hi}$ of about 20 or 25 samples).

FIGS. 12A, 12B and 12C correspond to a fifth example where the input signal (represented in FIG. 12A) includes an upward inclination followed by a downward inclination. Similar to the fourth example, the illustrated behavior may be considered composite behavior of the input signal. Also, the fifth example illustrates a degenerative case and where there is not sufficient criteria for alarming so long as the proximity to the lower or upper limits remains statistically insignificant. In this example, there is an upward trend in the first seventy three samples and a downward trend thereafter. The T-sequence (FIG. 12B) and normalized alarm signal (FIG. 12C) pick up the initial upward trend. Then, the normalized alarm signal trends toward the lower limit, which may trigger an alarm depending on the modified stopping rules.

Disclosed has been a temporal signal processing method and system for continuous monitoring of the status of a battery or an IED power supply component over time and to detect incipient problems that may otherwise remain unnoticed. The method may be adapted to any available parameter, such as a function of one or more of voltage, current, impedance or temperature. This reduces the reliance on specialized testing and data collection equipment. Under the system and method, imminent faults may be detected at an incipient stage to allow "just-in-time" maintenance. Also, past and present behavior of the monitored parameter are used in the analysis, which may mitigate the effect of outliers and measurement noise. Also, use of past and present values for the monitored parameter allows for gradual and incremental deviations to be revealed in a consistently applied manner through the use of a computerized or machine based implementation. User customization is simplified since alarm levels may be set against a normalized alarm signal that is contained within known bounds (e.g., −1 and +1). Further, the monitoring may work in an iterative manner that reduces computational complexity.

Also, the system may be embedded in a stand-alone battery monitoring device or in equipment likely to be present at the site of the battery, such as a breaker control device in a substation application.

Although certain embodiments have been shown and described, it is understood that equivalents and modifications falling within the scope of the appended claims will occur to others who are skilled in the art, upon the reading and understanding of this specification.

What is claimed is:

1. A method of monitoring a battery assembly, comprising:
    monitoring a parameter associated with the battery assembly to obtain a number of monitored parameter samples;
    generating a temporal sequence of monotonically increasing values from the monitored parameter samples, the sequence including at least three values;
    predicting a fault condition of the battery assembly when the temporal sequence of monotonically increasing values indicates a sustained inclination in the monitored parameter toward one of an upper predetermined value or a lower predetermined value, the upper and lower predetermined values selected to correspond to a condition for which the battery is monitored; and
    upon making the prediction, triggering an output to a user.

2. The method of claim 1, wherein the predicting includes deriving an alarm signal from the temporal sequence, the alarm signal having a series of values based on an application of a Laplace test statistic to the temporal sequence values.

3. The method of claim 2, wherein the predicting further includes comparing the alarm signal against at least one of an upper threshold or a lower threshold.

4. The method of claim 1, the predicting including:
    generating an alarm signal that indicates a deviation in the temporal sequence of monotonically increasing values toward an upper threshold set to correspond to the upper predetermined value or a lower threshold set to correspond to the lower predetermined value;
    comparing the alarm signal to the upper threshold and to the lower threshold; and
    making the prediction if the alarm signal violates the upper threshold or the lower threshold for a predetermined number of alarm signal values.

5. The method of claim 2, wherein the predicting further includes normalizing the alarm signal.

6. The method of claim 5, wherein the predicting further includes comparing the normalized alarm signal against at least one of an upper threshold or a lower threshold.

7. The method of claim 6, further comprising generating an alarm if the normalized alarm signal violates the upper threshold or the lower threshold for a predetermined number of alarm signal values.

8. The method of claim 6, further comprising generating an alarm if the normalized alarm signal violates the upper threshold or the lower threshold.

9. The method of claim 1, wherein the battery assembly is at least part of a lead acid battery system.

10. The method of claim 1, wherein the battery assembly is monitored while in use.

11. The method of claim 10, wherein the battery assembly is a primary power source for a load.

12. The method of claim 10, wherein the battery assembly is a backup power source for a load.

13. The method of claim 1, wherein the battery assembly is used in an electrical power transmission and distribution substation.

14. The method of claim 1, wherein the monitored parameter is a function of at least one of voltage, current, impedance or temperature.

15. The method of claim 4, further comprising:
    comparing the alarm signal to another upper threshold that indicates less deviation in the temporal sequence of monotonically increasing values than the upper threshold and to another lower threshold that indicates less deviation in the temporal sequence of monotonically increasing values than the lower threshold, the another upper and lower thresholds corresponding to a smaller degree of the monitored condition than the upper and lower thresholds; and
    if the alarm signal violates the another upper threshold or the another lower threshold for a predetermined number of alarm signal values, triggering an output to a user indicative of the smaller degree of the monitored condition.

16. A non-transitory computer readable medium storing a program, the program for monitoring a battery assembly and comprising:
    code that generates a temporal sequence of monotonically increasing values based on a series of monitored parameter samples, the monitored parameter samples obtained by monitoring a parameter associated with the battery assembly, the sequence including at least three values; and
    code that predicts a fault condition of the battery assembly when the temporal sequence of monotonically increasing values indicates a sustained inclination in the monitored parameter toward one of an upper predetermined value or a lower predetermined value, the upper and lower predetermined values selected to correspond to a battery condition for which the battery is monitored; and
    code that triggers an output to a user upon making the prediction.

17. The non-transitory computer readable medium of claim 16, wherein the code that predicts derives an alarm signal from the temporal sequence, the alarm signal having a series of values based on an application of a Laplace test statistic to the temporal sequence values.

18. The non-transitory computer readable medium of claim 16, wherein the code that predicts includes code that:
    generates an alarm signal that indicates a deviation in the temporal sequence of monotonically increasing values toward an upper threshold set to correspond to the upper predetermined value or a lower threshold set to correspond to the lower predetermined value;
    compares the alarm signal to the upper threshold and the lower threshold; and
    makes the prediction if the alarm signal violates the upper threshold or the lower threshold for a predetermined number of alarm signal values.

19. The non-transitory computer readable medium of claim 18, wherein the representation of the alarm signal is a normalized alarm signal.

20. The non-transitory computer readable medium of claim 18, further comprising code that:
    compares the alarm signal to another upper threshold that indicates less deviation in the temporal sequence of monotonically increasing values than the upper threshold and to another lower threshold that indicates less deviation in the temporal sequence of monotonically increasing values than the lower threshold, the another upper and lower thresholds corresponding to a smaller degree of the monitored condition than the upper and lower thresholds; and if the alarm signal violates the another upper threshold or the another lower threshold for a predetermined number of alarm signal values, triggers an output to a user indicative of the smaller degree of the monitored condition.

21. A predictive monitoring assembly for a battery assembly, comprising an analyzer configured to:
  generate a temporal sequence of monotonically increasing values based on a series of monitored parameter samples, the monitored parameter samples obtained by monitoring a parameter associated with the battery assembly, the sequence including at least three values;
  predict a fault condition of the battery assembly when the temporal sequence of monotonically increasing values indicates a sustained inclination in the monitored parameter toward one of an upper predetermined value or a lower predetermined value, the upper and lower predetermined values selected to correspond to a condition for which the battery is monitored; and
  upon making the prediction, trigger an output to a user.

22. The predictive monitoring assembly of claim 21, wherein the analyzer derives an alarm signal from the temporal sequence, the alarm signal having a series of values based on an application of a Laplace test statistic to the temporal sequence values.

23. The predictive monitoring assembly of claim 21, wherein, to make the prediction, the analyzer:
  derives an alarm signal that indicates a deviation in the temporal sequence of monotonically increasing values toward an upper threshold set to correspond to the upper predetermined value or a lower threshold set to correspond to the lower predetermined value;
  compares the alarm signal to the upper threshold and the lower threshold; and
  makes the prediction if a representation of the alarm signal violates the upper threshold or the lower threshold for a predetermined number of alarm signal values.

24. The predictive monitoring assembly of claim 21, further comprising a monitoring assembly that measures a parameter associated with the battery assembly.

25. The predictive monitoring assembly of claim 21, wherein the battery assembly is at least part of a lead acid battery system.

26. The predictive monitoring assembly of claim 21, wherein the battery assembly is monitored while in use.

27. The predictive monitoring assembly of claim 26, wherein the battery assembly is a primary power source for a load.

28. The predictive monitoring assembly of claim 26, wherein the battery assembly is a backup power source for a load.

29. The predictive monitoring assembly of claim 21, wherein the battery assembly is used in an electrical power transmission and distribution substation.

30. The predictive monitoring assembly of claim 21, wherein the monitored parameter is a function of at least one of voltage, current, impedance or temperature.

31. The predictive monitoring assembly of claim 23, wherein the analyzer is further configured to:
  compare the alarm signal to another upper threshold that indicates less deviation in the temporal sequence of monotonically increasing values than the upper threshold and to another lower threshold that indicates less deviation in the temporal sequence of monotonically increasing values than the lower threshold, the another upper and lower thresholds corresponding to a smaller degree of the monitored condition than the upper and lower thresholds; and
  if the alarm signal violates the another upper threshold or the another lower threshold for a predetermined number of alarm signal values, trigger an output to a user indicative of the smaller degree of the monitored condition.

* * * * *